(12) United States Patent
Lin

(10) Patent No.: US 6,338,640 B1
(45) Date of Patent: Jan. 15, 2002

(54) ZIF MOBILE SOCKET

(75) Inventor: Nick Lin, Hsin-Chuang (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/954,358

(22) Filed: Sep. 12, 2001

(51) Int. Cl.[7] ................................................ H01R 4/50

(52) U.S. Cl. ...................................................... 439/342

(58) Field of Search ................................ 439/342, 259, 439/265, 266, 268, 263

(56) References Cited

U.S. PATENT DOCUMENTS 6,254,415 B1 * 7/2001 Mizumura et al. .......... 439/342

* cited by examiner

Primary Examiner—Tho D. Ta
(74) Attorney, Agent, or Firm—Wei Te Chung

(57) ABSTRACT

A mobile socket (1) comprises a base (10), a cover (20), a plurality of contacts (30) mounted in the base, a rotatable cam actuator (40) for actuating the cover to slide on the base, a protecting mechanism (50) and a washer (60). The protecting mechanism comprises a cover plate (51) in the cover and a bottom plate (52) in the base. The cover plate defines an elongated slot (512). A pair of opposite cam stoppers (515) extends upwardly from one side of the slot. The cam actuator has a protrusion (45) abutting against one of the cam stoppers during rotation.

14 Claims, 6 Drawing Sheets

US 6,338,640 B1

ZIF MOBILE SOCKET

BACKGROUND OF THE INVENTION

1. Field of the Invention

The present invention relates to an electrical socket, and particularly to a ZIF (Zero Insertion Force) mobile socket for use with a PGA (Pin Grid Array) chip.

2. Description of the Prior Art

A ZIF socket is often used to mount a PGA chip onto a printed circuit board (PCB). One example of such connectors comprises a plastic base, a plastic cover mounted onto the base, a plurality of electrical contacts received in the base, and a metallic cam actuator. The cover is actuated to slide on the base by rotation of the metallic cam actuator, thereby causing pins of the PGA package mounted on the cover to engage with/disengage from the contacts in the base. Referring to FIG. 6, the plastic cover 8 defines an arc-shaped recess 81 in one side thereof. A stop wall 82 is provided at each end of the arc-shaped recess 81. The metallic cam actuator 9 comprises an outwardly protruding protrusion 91. The protrusion 91 of the cam actuator 9 is rotatable in the arc-shaped recess 81. Rotation of the cam actuator 9 causes the cover 8 to slide on the base (not shown), mating or unmating the pins of the PGA package (not shown) on the cover 8 with the contacts (not shown) of the base.

However, when the protrusion 91 rotates between the two limit positions defined by the stop walls 82 and abuts against one of the stop walls 82, the large force exerted by the protrusion 91 may tend to damage the stop wall 82 during operation of the mobile socket, thereby causing malfunction of the socket. Further, the plastic cover 8 is apt to be worn out by the rotation of the metallic cam actuator 9 therein, resulting in a shortened life thereof, and in turn a shortened life of the mobile socket.

Therefore, an improved mobile socket is desired to overcome the disadvantages of the prior art.

SUMMARY OF THE INVENTION

The major object of the present invention is to provide a ZIF PGA socket having a protecting mechanism which protects the cover and the base of the mobile socket for a lengthened life.

An electrical mobile socket in accordance with the present invention comprises an insulative base, a dielectric cover, a plurality of electrical contacts, a metallic cam actuator, a protecting mechanism and a washer. The base comprises an insulative housing, an opening and a plurality of passageways. The insulative housing comprises a T-shaped recess in the middle of an end thereof. The bottom of the recess defines a through hole. The cover comprises an insulative housing, an opening and a ledge. The ledge has a top hole and a pair of stop walls. The protecting mechanism comprises a T-shaped metal cover plate insert molded in the cover and a T-shaped metal bottom plate received in the recess of the base. The cover plate defines an elongated slot and a pair of arc-shaped holes provided on opposite sides of the slot at the middle and in communication with the slot. The two arc-shaped holes together with a middle portion of the slot define a through hole. A pair of upwardly extending cam stoppers are provided on one side of the slot and on opposite sides of one arc-shaped hole. The bottom plate defines a rectangular through hole in the middle thereof. The cam actuator comprises an upper disk, a lower disk and a lower cam block. The upper disk has a lateral protrusion protruding from a side thereof. The cam block comprises a riveting end coaxial with the cam block at a lower end thereof. The rotational axis of the cam block is offset from a rotational axis of the lower disk. Rotation of the cam actuator causes the cover to slide on the base, mating or unmating pins of a PGA package on the cover with the contacts of the base.

Other objects, advantages and novel features of the invention will become more apparent from the following detailed description of the present embodiment when taken in conjunction with the accompanying drawings.

DETAILED DESCRIPTION OF THE INVENTION

Figure 1:
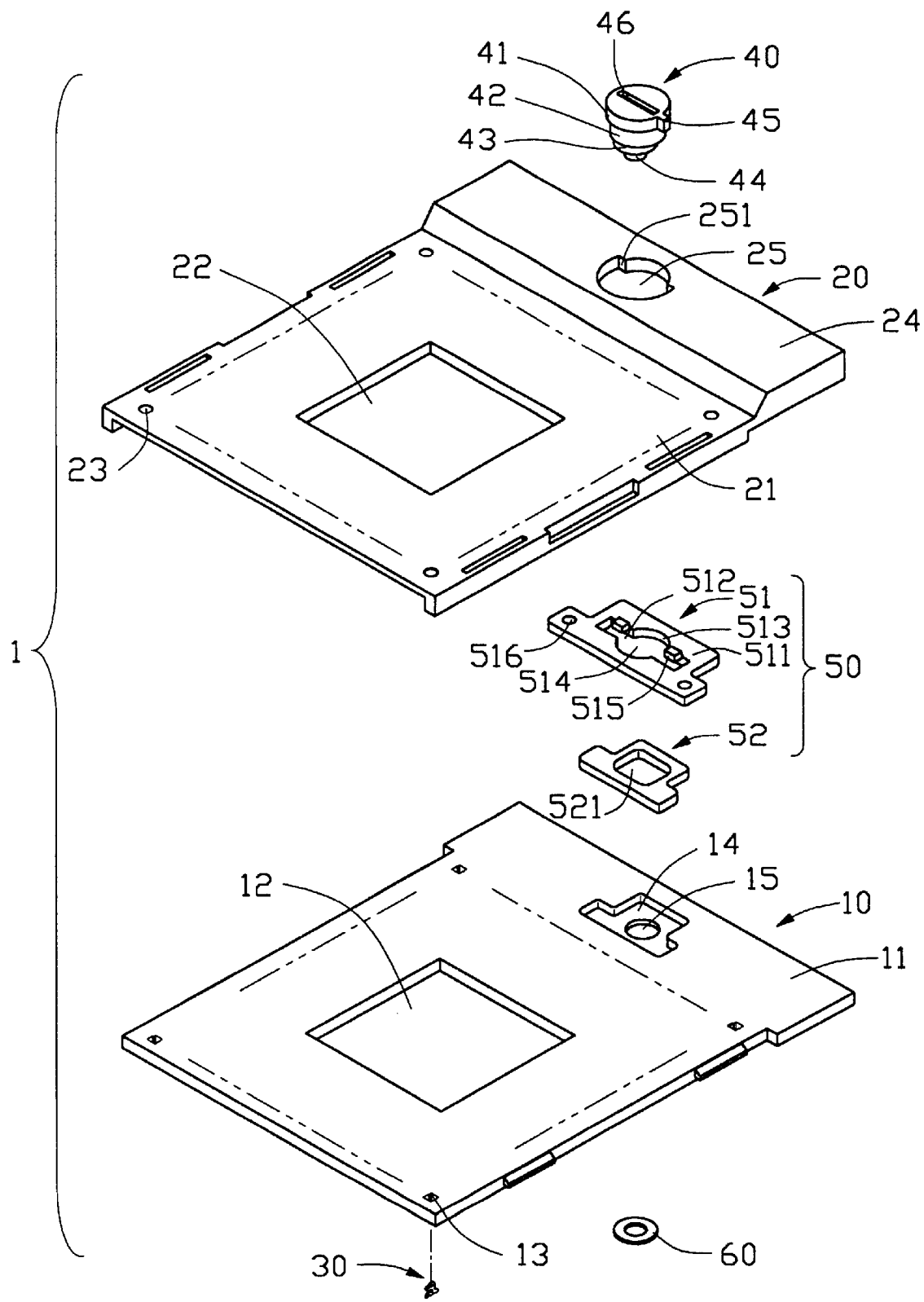
FIG. 1 is an exploded, perspective view of a ZIF mobile socket in accordance with a first embodiment of the present invention.
Figure 2:
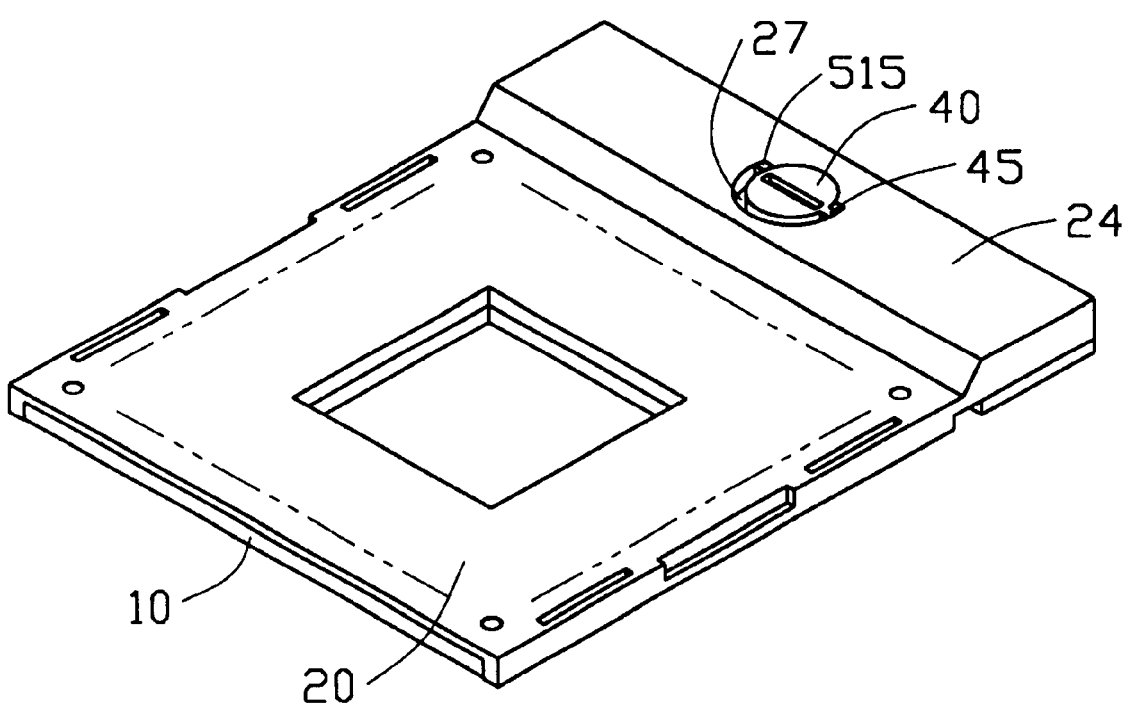
FIG. 2 is an assembled view of FIG. 1.

Referring to FIGS. 1 and 2, an electrical mobile socket 1 in accordance with the present invention comprises an insulative base 10, a dielectric cover 20, and a plurality of electrical contacts 30, a metallic cam actuator 40, a protecting mechanism 50 and a washer 60.

The base 10 is generally in the shape of a square and comprises an insulative housing 11, an opening 12 defined in the middle of the insulative housing 11 and a plurality of passageways 13 extending vertically through the insulative housing 11 to receive the plurality of contacts 30. The insulative housing 11 comprises a T-shaped recess 14 in the middle of an end thereof. The bottom of the recess 14 defines a through hole 15.

The cover 20 has a shape corresponding to that of the base 10 and comprises an insulative housing 21, an opening 22 defined in the middle of the insulative housing 21 and a ledge 24 defined at one end thereof. A plurality of passages 23 extend through the insulative housing 21 in alignment with the passageways 13 of the base 10. The ledge 24 defines a top hole 25 in the middle thereof. The top hole 25 consists of two semicircle-shaped holes of different diameters. A pair of opposite stop walls 251 are provided at the junction of the two semicircle-shaped holes.

Figure 3:
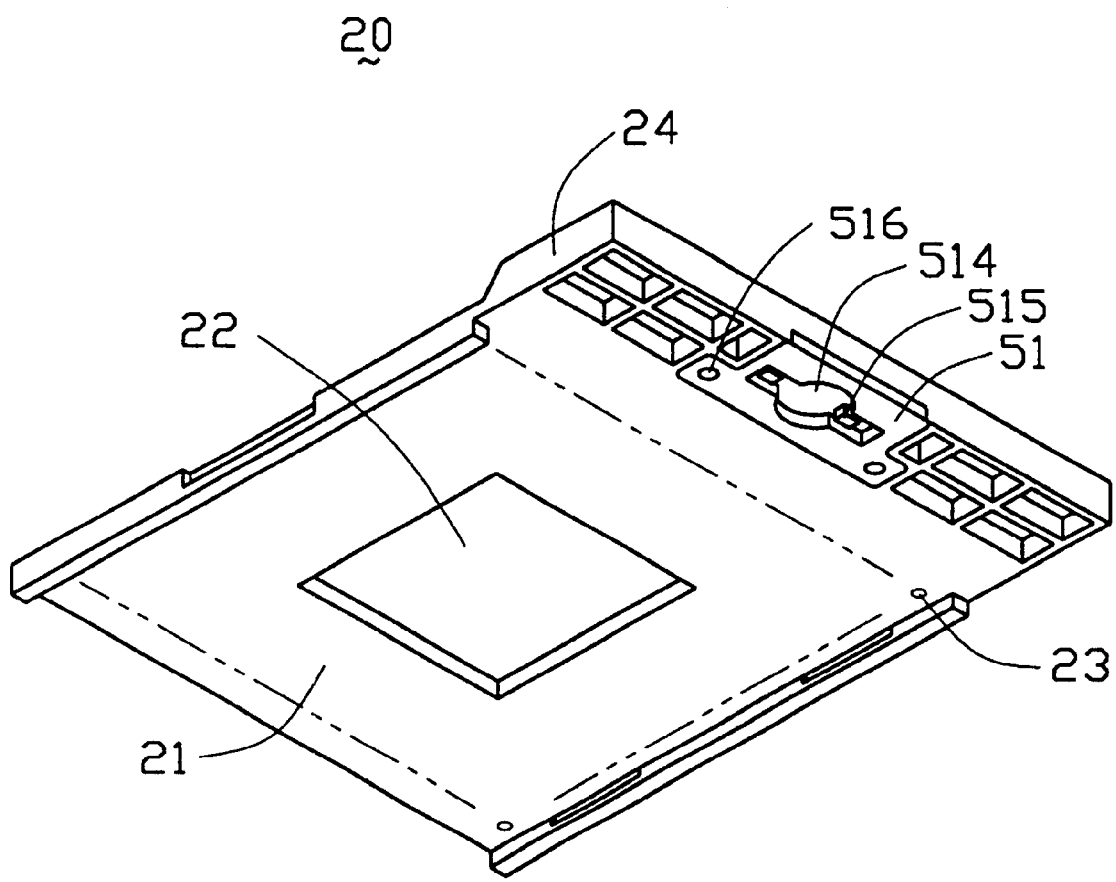
FIG. 3 is a bottom, perspective view of a cover of the mobile socket in accordance with the present invention.

The protecting mechanism 50 comprises a T-shaped metal cover plate 51 insert molded in the cover 20 (referring to FIG. 3) and a T-shaped metal bottom plate 52 received in the recess 14 of the base 10. The cover plate 51 comprises a body 511. The body 511 defines an elongated slot 512 in the middle thereof. A pair of arc-shaped holes 513 are provided on opposite sides of the slot 512 at the middle of and in communication with the slot 512. The two arc-shaped holes 513 together with a middle portion of the slot 512 define a through hole 514. A pair of upwardly extending cam stoppers 515 are provided on one side of the slot 512 and on opposite sides of one arc-shaped hole 513. The body 511 also defines a pair of small holes 516 for orientation of the cover plate 51 insert molded in the cover 20. The bottom plate 52 defines a rectangular or capsular through hole 521 in the middle thereof.

The cam actuator 40 comprises an upper disk 41, a lower disk 42 and a lower cam block 43. The upper disk 41 is coaxial with the lower disk 42 and has a diameter larger than the lower disk 42. The upper disk 41 defines an elongated groove 46 recessed in an upper surface thereof and comprises an outwardly protruding protrusion 45. The elongated groove 46 has two closed opposing longitudinal ends. Thus, a tool can be confinedly fitted into the groove 46 to exert a rotation force on the cam actuator 40, without the possibility that the tool may slide along the groove 46 beyond the periphery of the upper disk 41. The cam block 43 is formed beneath the lower disk 42 and comprises a riveting end 44 coaxial with the cam block 43 at a lower end thereof. A rotational axis of the cam block 43 is offset from a rotational axis of the lower disk 42.

Referring to FIGS. 1 to 4, in assembly, first, the bottom plate 52 is received in the recess 14 of the base 10. Second, the cover 20 together with insert molded cover plate 51 is assembled onto the base 10. Successively, the cam actuator 40 is mounted into the mobile socket 1 from the top via the top holes 25 and then through the through holes 514 and 521. The cam block 43 of the cam actuator 40 extends through the rectangular through hole 521 of the bottom plate 52 and the riveting end 44 thereof is riveted with the washer 60 attached on a lower surface of the base 10, whereby the cam actuator 40, the cover 20, the base 10, and the washer 60 are assembled together.

Figure 4:
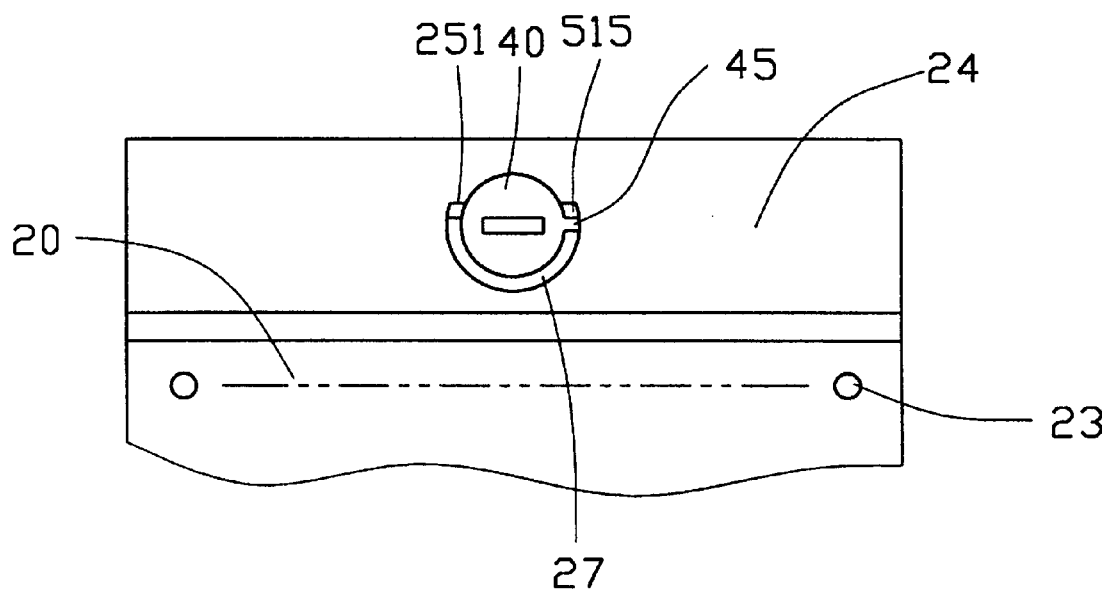
FIG. 4 is a partial, top plan view illustrating the engagement between a cam actuator and a cover plate of a protecting mechanism of FIG. 1 according to the first embodiment of the present invention.

Referring to FIG. 4, an arc-shaped recess 27 is formed between the upper disk 41 of the cam actuator 40 and the larger diameter semicircle-shaped hole of the top hole 25 of the cover 20. The protrusion 45 of the cam actuator 40 is rotatable in the arc-shaped recess 27. The cam stopper 515 of the cover plate 51 abuts against the stop wall 251 of the cover 20. In operation, after the PGA chip is loaded on the cover 20, the external tool (not shown) is fitted into the groove 46 to rotate the cam actuator 40 until the protrusion 45 thereof reaches one of the two limit positions defines by the two cam stoppers 515 and abuts against one of the cam stoppers 515 of the cover plate 51 which abuts against the stop wall 251 of the cover 20. Since the axis of the cam block 43 is offset from the axis of the upper disk 41, the rotation of the cam actuator 40 forces the cover 20 to slide along the base 10 in a diagonal direction, thereby making the pins (not shown) of the PGA package engage with the contacts 30 in the passageways 13. To open the pin-socket contact connection, the cam actuator 40 is rotated in an opposite direction from one of the two cam stoppers 515, to the other cam stoppers 515, thereby disengaging the pins of the PGA package from the contacts 30 of the mobile socket 1 and allowing the PGA chip to be removed from the cover 20.

When the protrusion 45 rotates between the two limit positions and abuts against the cam stopper 515, the cam stopper 515 can endure the large force exerted by the protrusion 45, thereby preventing the over rotation of the cam actuator 40 and protecting the stop wall 251 of the cover 20. Furthermore, since the cover plate 51 and the bottom plate 52 are made of a metallic material, the plastic area of the base 10 and the cover 20 abutted against by the cam actuator 40 is protected, giving it a longer life than the prior art plastic area, and in turn giving the electrical mobile socket 1 a longer life. The cover plate 51 and the bottom plate 52 can also enhance the retention between the base 10 and the cover 20.

Figure 5:
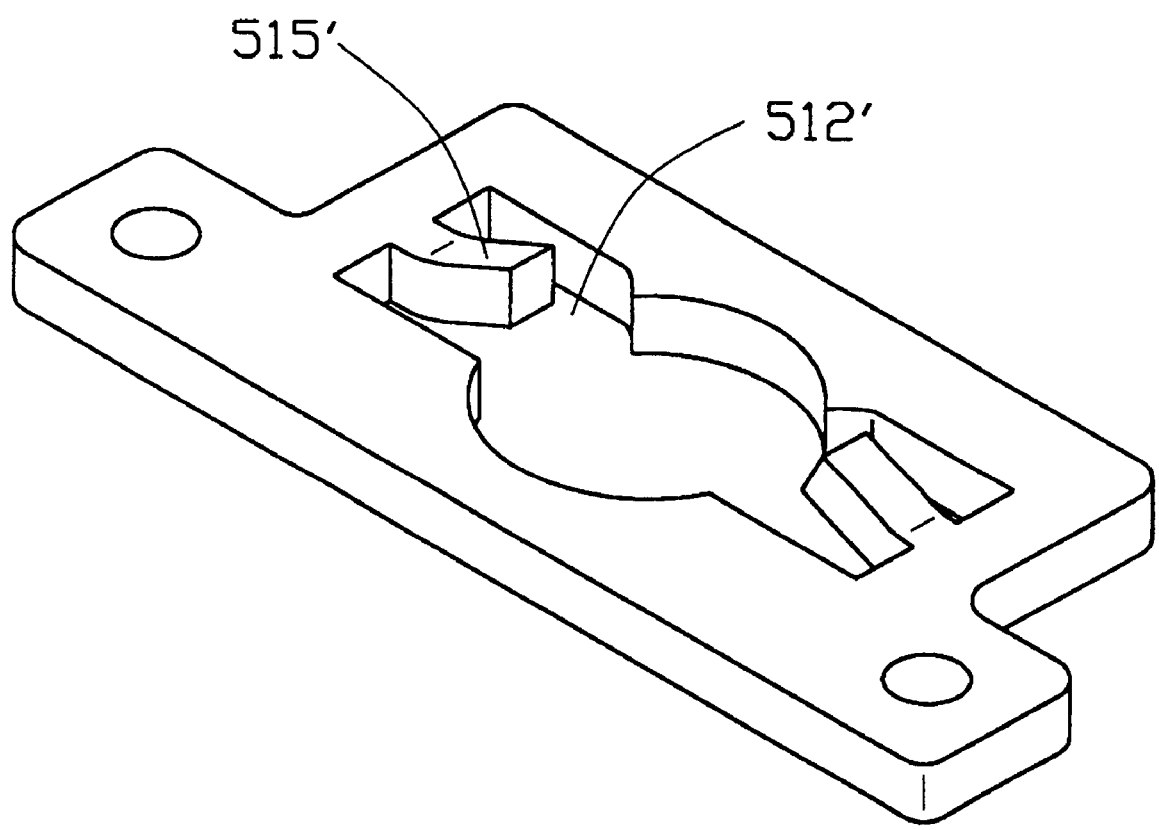
FIG. 5 is a perspective view of the cover plate of the protecting mechanism according to a second embodiment of the present invention.
Figure 6:
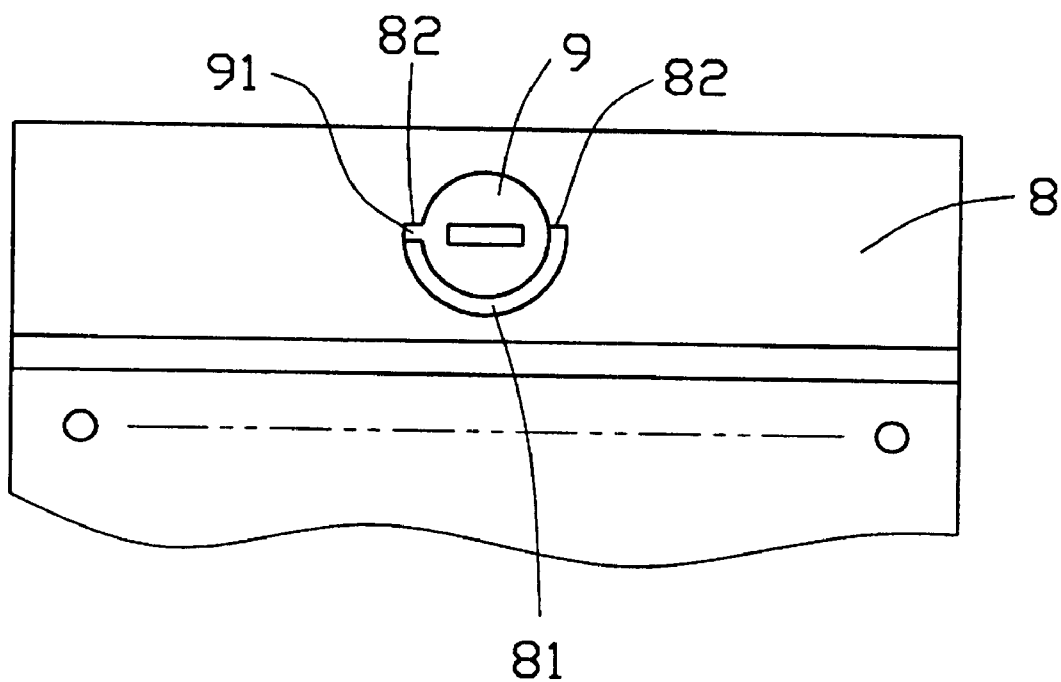
FIG. 6 is a partial, top plan view illustrating the engagement between a cam actuator and a conventional protecting mechanism of the mobile socket.

Referring to FIG. 5, a cover plate 51' according to a second embodiment of the present invention has a structure similar to the cover plate 51 as shown in FIG. 1. The cover plate 51' comprises an elongated slot 512'. A pair of cam stoppers 515' aslant extends upwardly from two opposite ends of the slot 512' in a direction toward each other. The cover plate 51' is also insert molded in the cover 20. The cam stopper 515' is located in front of the stop wall 251 of the cover 20 and performs the same function as the cam stopper 515. It should be noted that the cover plate 51, 51' can be mechanical mounted into the cover 20 rather than insert molding.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical mobile socket for use with a PGA (Pin Grid Array) chip, comprising:
    a base comprising a plurality of passageways;
    a plurality of electrical contacts received in the passageways;
    a cover slidably mounted on the base, the cover comprising a top hole and a plurality of passages in alignment with the passageways of the base;
    a protecting mechanism positioned between said cover and said base, said protecting mechanism comprising a cover plate retained in the cover and a bottom plate received in the base, the cover plate defining a through hole in alignment with the top hole of the cover, and a pair of upwardly extending cam stoppers formed on opposite sides of the through hole and extending into the top hole of the cover;
    a cam actuator rotatably assembled with the base, the cover, and the protecting mechanism for actuating the cover to slide on the base, the cam actuator having an upper disk received in the top hole of the cover, the upper disk having an outwardly protruding protrusion abuttable against either cam stopper during rotation; and
    wherein each of the cover plate and the bottom plate defines an elongated slot intersecting the through hole.

2. The electrical mobile socket as claimed in claim 1, wherein the cover plate is inserted molded in the cover.

3. The electrical mobile socket as claimed in claim 1, further comprising a washer, the washer riveting the riveting end of the cam actuator for assembling the cam actuator to the cover and the base.

4. The electrical mobile socket as claimed in claim 1, wherein the cam stoppers extend upwardly and vertically from one side of the slot.

5. The electrical mobile socket as claimed in claim 4, wherein the cam stoppers vertically extend upwardly from two opposite ends of the slot.

6. The electrical mobile socket as claimed in claim 1, wherein the cam actuator comprises a lower disk and a lower cam block, the lower cam block comprising a riveting end coaxial with the cam block at a lower end thereof.

7. The electrical mobile socket as claimed in claim 6, wherein the upper disk is coaxial with the lower disk and the cam block is formed beneath the lower disk and has a rotational axis offset from that of the upper disk.

8. The electrical mobile socket as claimed in claim 1, wherein the upper disk defines an elongated groove recessed in an upper surface thereof.

9. The electrical mobile socket as claimed in claim 8, wherein the base comprises a recess receiving the bottom plate, the recess defining a bottom through hole for extension of the riveting end of the cam actuator.

10. The electrical mobile socket as claimed in claim 1, wherein the cover has a shape corresponding to that of the base and comprises an insulative housing, an opening defined in a middle of the insulative housing, and a ledge at one end thereof.

11. The electrical mobile socket as claimed in claim 10, wherein the top hole is defined in the middle of the ledge and consists of two semicircle-shaped holes of different diameters, and a pair of stop walls are provided at the junction of the two semicircle-shaped holes.

12. An electrical socket comprising:
   a stationary base with a plurality of passageways therein;
   a plurality of terminals respectively received within the corresponding passageways;
   a moveable cover slidably mounted upon the socket and defining a plurality of passages in alignment with the corresponding passageways, respectively;
   a protecting mechanism positioned between said cover and said base, said protecting mechanism including a cover plate moveable along with the cover, and a bottom plate stationarily retained to the base;
   a cam actuator defining lower first and upper second sections, of which one is equipped with an eccentric center with regard to the other; wherein the bottom plate defines a first through hole and the cover plate defines a second through hole respectively engageably receiving the first section and the second section for moving the cover relative to the base in a front-to-back direction when said cam actuator is rotated; and
   wherein a pair of stoppers are integrally formed with the cover plate and substantially positioned above a plain body of the cover plate to abut against a protrusion formed on a top portion of the cam actuator.

13. The socket as claimed in claim 12, wherein said first through hole is of a capsular shape and said second through hole is of a circular shape.

14. An electrical socket comprising:
   a stationary base with a plurality of passageways therein;
   a plurality of terminals respectively received within the corresponding passageways;
   a moveable cover slidably mounted upon the socket and defining a plurality of passages in alignment with the corresponding passageways, respectively;
   a protecting mechanism positioned between said cover and said base, said protecting mechanism including a cover plate moveable along with the cover, and a bottom plate stationarily retained to the base; and
   a cam actuator extending through both the cover plate and the bottom plate; wherein
   the cover defines a circular top hole and the cam actuator defines an engagement protrusion located at the same level with said top hole, and a pair of stoppers are integrally formed with said cover plate and upwardly extend to reach said same level for respective and mutually exclusive engagement with said engagement protrusion when said cam actuator is rotated to two opposite ultra positions.

* * * * *